US011271524B2

(12) United States Patent
Bushman et al.

(10) Patent No.: US 11,271,524 B2
(45) Date of Patent: Mar. 8, 2022

(54) MULTI-ELEMENT RESONATOR

(71) Applicant: FUTUREWEI TECHNOLOGIES, INC., Plano, TX (US)

(72) Inventors: Michael Bushman, Manitowoc, WI (US); James Caldwell, Elgin, IL (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 17/176,084

(22) Filed: Feb. 15, 2021

(65) Prior Publication Data

US 2021/0242832 A1 Aug. 5, 2021

Related U.S. Application Data

(63) Continuation of application No. 16/029,905, filed on Jul. 9, 2018, now Pat. No. 10,924,059.

(51) Int. Cl.
| | |
|---|---|
| *H03B 5/12* | (2006.01) |
| *H03L 7/099* | (2006.01) |
| *G06F 1/10* | (2006.01) |
| *H03F 1/38* | (2006.01) |

(52) U.S. Cl.
CPC ............... *H03B 5/12* (2013.01); *G06F 1/10* (2013.01); *H03B 5/1206* (2013.01); *H03B 5/1212* (2013.01); *H03B 5/1218* (2013.01); *H03B 5/1228* (2013.01); *H03B 5/1243* (2013.01); *H03F 1/38* (2013.01); *H03L 7/099* (2013.01); *H03B 2200/0076* (2013.01); *H03B 2201/0208* (2013.01); *H03F 2200/138* (2013.01); *H03F 2203/45134* (2013.01)

(58) Field of Classification Search
CPC .. H03B 5/1228; H03B 5/1243; H03B 5/1212; H03B 2200/0076; H03B 5/1206; H03B 5/1218; H03B 5/12; H03L 7/099; H03F 1/38; H03F 2200/138; H03F 2203/45134; G06F 1/10
USPC ................................. 331/167, 117 FE, 177 V
See application file for complete search history.

(56) References Cited

U.S. PATENT DOCUMENTS

| | | | |
|---|---|---|---|
| 6,667,668 B1 | 12/2003 | Henrion | |
| 2005/0265053 A1 | 12/2005 | Higashi et al. | |
| 2007/0176704 A1* | 8/2007 | Gabara | ................ H03B 5/1215 331/167 |
| 2009/0289727 A1* | 11/2009 | El Rai | .................. H03B 5/1215 331/46 |

(Continued)

FOREIGN PATENT DOCUMENTS

| | | |
|---|---|---|
| CN | 101820222 A | 9/2010 |
| CN | 102423258 A | 4/2012 |
| CN | 103296782 A | 9/2013 |

*Primary Examiner* — Arnold M Kinkead
(74) *Attorney, Agent, or Firm* — James Anderson Harrison

(57) ABSTRACT

A resonant tank includes a first capacitor formed on a semiconductor substrate, a first inductor formed on the semiconductor substrate, a second capacitor formed on the semiconductor substrate, and a second inductor formed on the semiconductor substrate. The first capacitor, the first inductor, the second capacitor, and the second inductor are connected in a ring configuration, with each capacitor connected between a pair of the inductors and with each inductor connected between a pair of the capacitors. An amplifier circuit is coupled to the resonant tank and configured to amplify a signal in the resonant tank.

16 Claims, 13 Drawing Sheets

(56) References Cited

U.S. PATENT DOCUMENTS

| | | |
|---|---|---|
| 2012/0161890 A1 | 6/2012 | Li et al. |
| 2013/0082790 A1* | 4/2013 | Trivedi .................. H03L 7/099 |
| | | 331/117 FE |
| 2018/0131323 A1 | 5/2018 | Shu et al. |

* cited by examiner

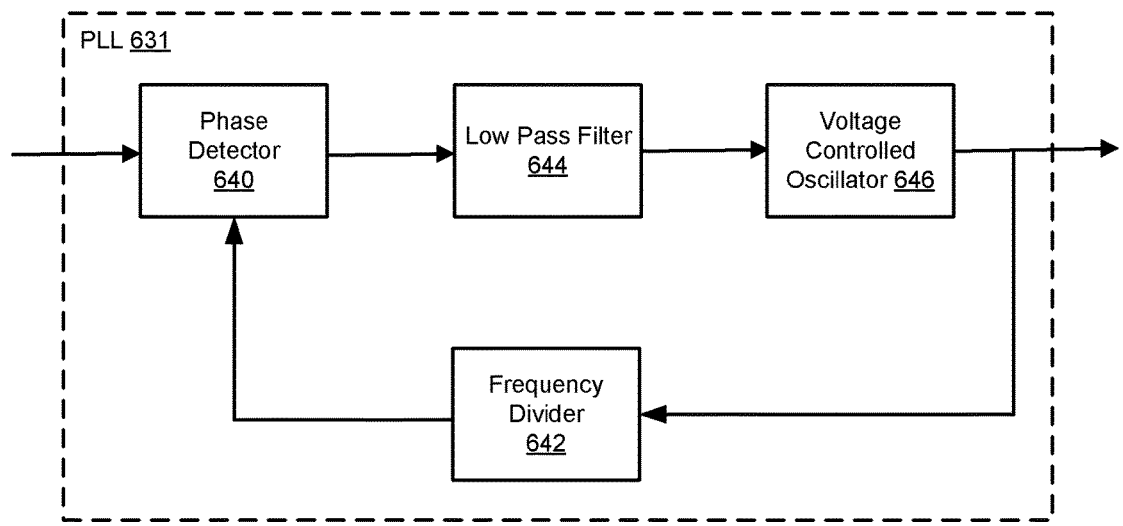
FIG. 6
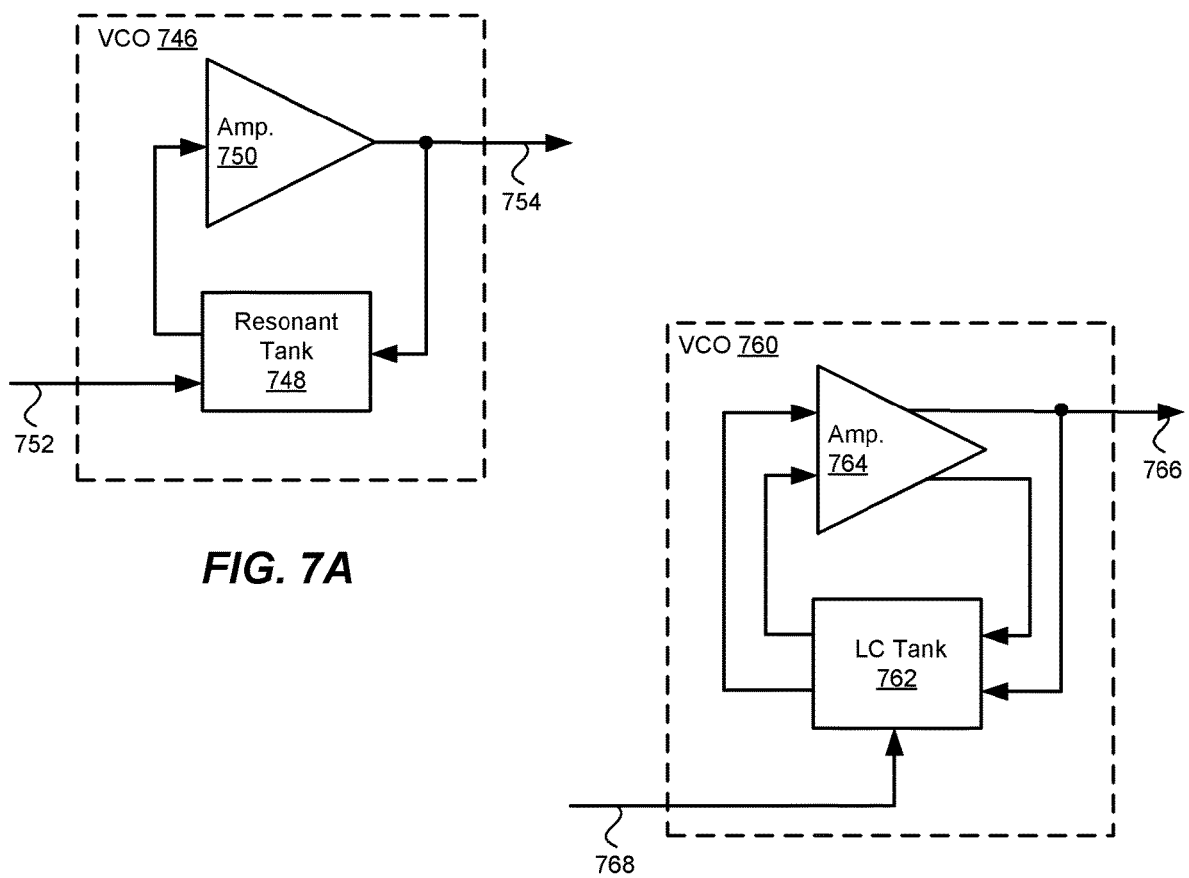
FIG. 7A
FIG. 7B

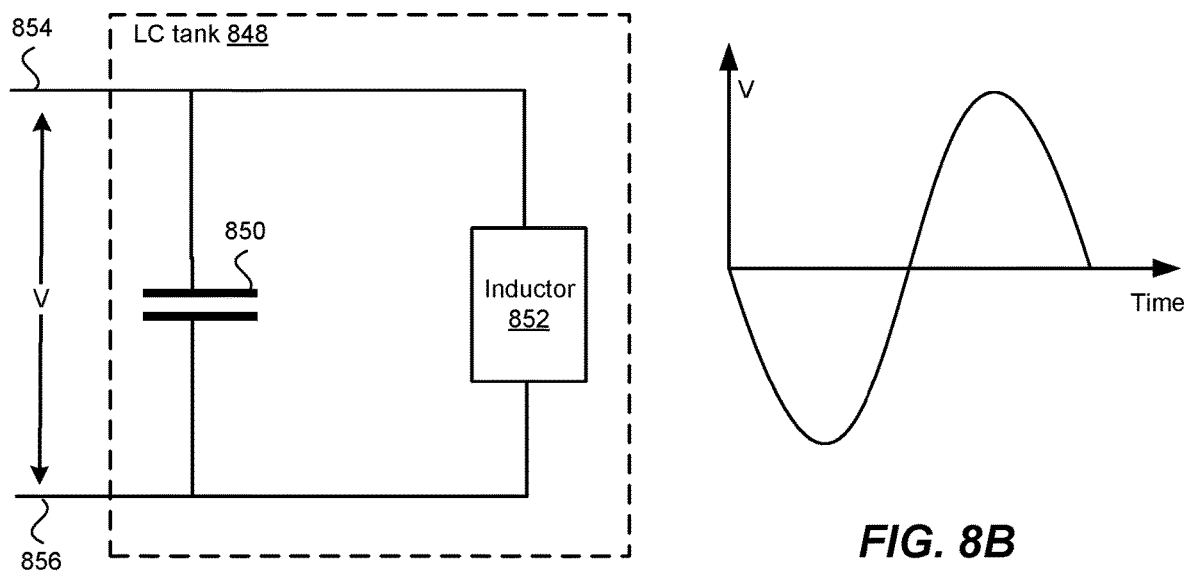
FIG. 8A
FIG. 8B
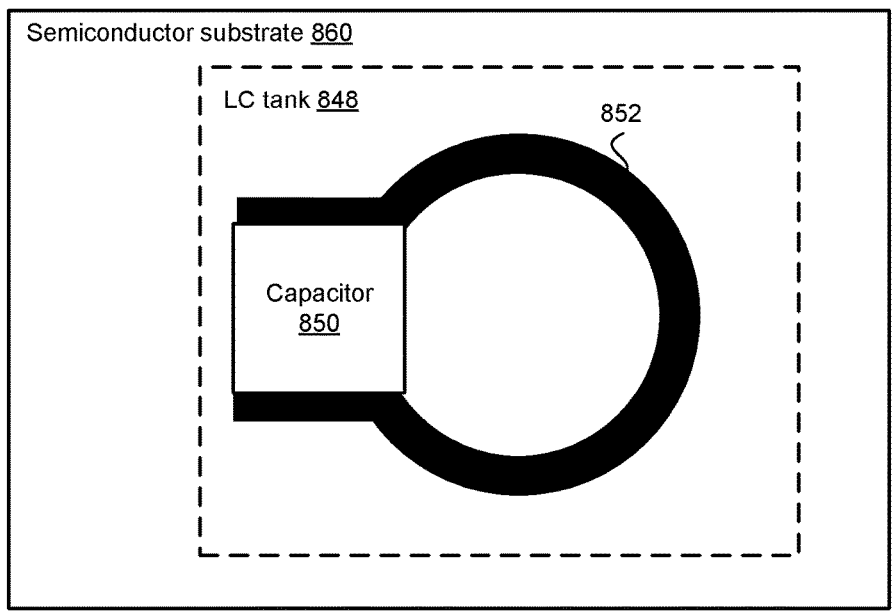
FIG. 8C

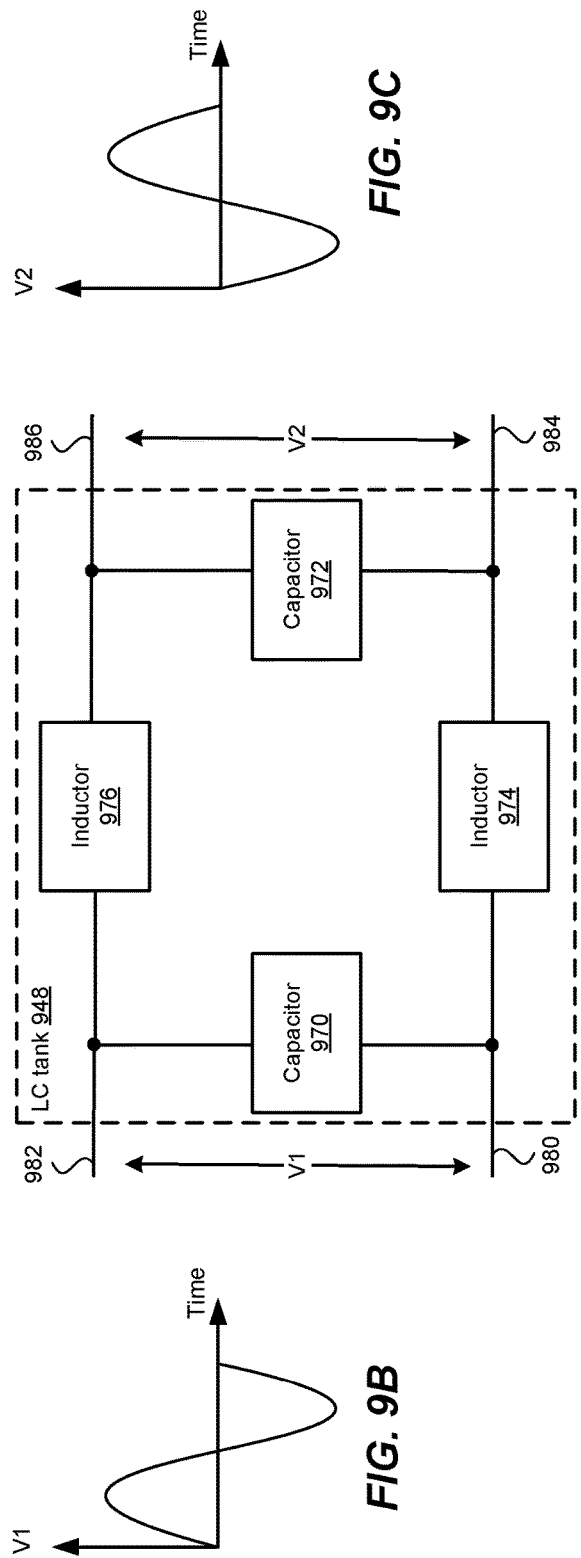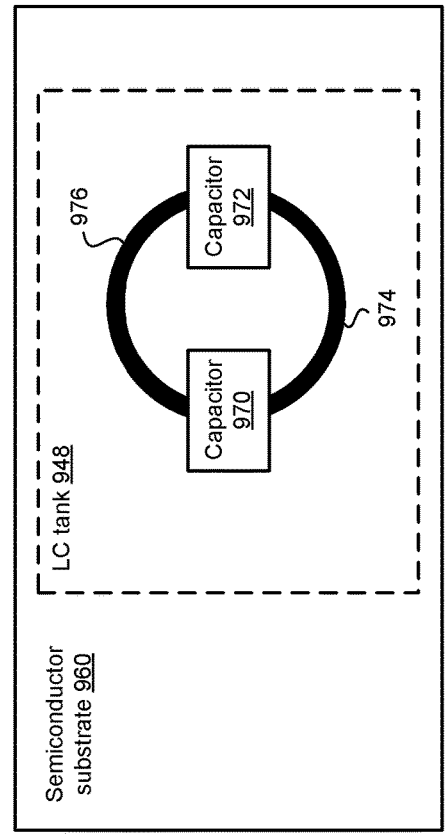

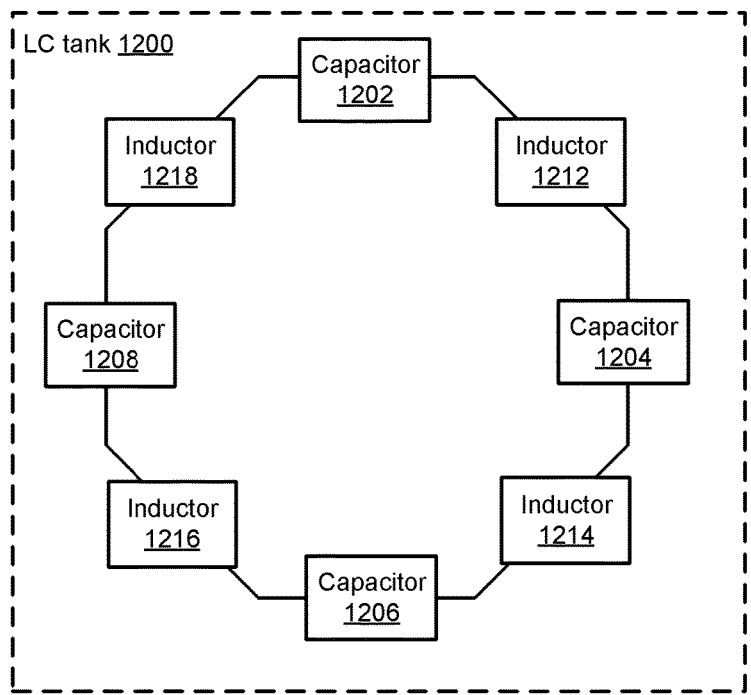

Providing an electrical input to a resonant tank that includes a first capacitor, a first inductor, a second capacitor, and a second inductor, formed on the semiconductor substrate, and connected in a ring configuration with each capacitor connected between inductors and each inductor connected between capacitors

1302

Amplifying an electrical signal generated from the electrical input in the resonant tank to generate an oscillator signal at a resonant frequency of the resonant tank

FIG. 13

MULTI-ELEMENT RESONATOR

CROSS-REFERENCE TO RELATED APPLICATIONS

This application is a continuation of U.S. patent application Ser. No. 16/029,905(now U.S. Pat. No. 10,924,059), filed on Jul. 9, 2018, the disclosures of which are hereby incorporated by reference in their entireties.

FIELD

The disclosure generally relates to electrical circuits including integrated circuits used in communications.

BACKGROUND

Electronic circuits, including electronic circuits formed as integrated circuits (ICs) on semiconductor substrates, are used in a variety of applications including in communication systems. For example, a transmitter circuit may be formed of one or more integrated circuits formed on one or more silicon substrates and a receiver circuit may be formed of one or more integrated circuits formed on one or more silicon substrates. In general, there is a trend in integrated circuit technology towards smaller feature size in order to make circuits smaller and reduce cost. Smaller feature sizes may affect circuits in many ways and not all circuits scale identically. As feature sizes get smaller, devices may have lower breakdown voltages, which may be overcome by designing for lower voltages to ensure that breakdown voltages are not exceeded. Lower voltages may affect IC characteristics including IC characteristics of transmitter and receiver circuits formed as or of ICs.

BRIEF SUMMARY

According to one aspect of the present disclosure, there is provided an oscillator circuit comprising: a resonant tank including a first capacitor formed on a semiconductor substrate, a first inductor formed on the semiconductor substrate, a second capacitor formed on the semiconductor substrate, and a second inductor formed on the semiconductor substrate, the first capacitor, the first inductor, the second capacitor, and the second inductor connected in a ring configuration with each capacitor connected between a pair of the inductors and each inductor connected between a pair of the capacitors; and an amplifier circuit coupled to the resonant tank and configured to amplify a signal in the resonant tank.

Optionally, in any of the preceding aspects, each of the first inductor and the second inductor is formed by one or more respective portions of metal deposited on the semiconductor substrate.

Optionally, in any of the preceding aspects, the first inductor and second inductor are tapped inductors each having at least one tapped input terminal at an intermediate location between inductor ends.

Optionally, in any of the preceding aspects, the amplifier circuit includes a first inverter connected to a said tapped input terminal of the first inductor and a second inverter connected to a said tapped input terminal of the second inductor.

Optionally, in any of the preceding aspects, the amplifier circuit includes a first pair of inverters connected across the first inductor and a second pair of inverters connected across the second inductor.

Optionally, in any of the preceding aspects, the first capacitor is a variable capacitor with a capacitance that is variable over a predetermined range to control a resonant frequency of the oscillator circuit.

Optionally, in any of the preceding aspects, the first capacitor comprises at least a first capacitive element and a second capacitive element with one or more switches to modify a capacitance of the first capacitor by discrete amounts according to connection of the first capacitive element and the second capacitive element.

Optionally, in any of the preceding aspects, the first capacitor includes one or more variable capacitive elements each with a respective capacitance that is variable over a continuous range according to an applied voltage.

Optionally, in any of the preceding aspects, the oscillator circuit forms a Voltage Controlled Oscillator (VCO) in a Phase Locked Loop (PLL) circuit that further includes a feedback loop, a phase detector, and a filter.

Optionally, in any of the preceding aspects, the Phase Locked Loop (PLL) circuit is configured to provide an oscillator signal in a transmitter or receiver in user equipment in a communications system.

Optionally, in any of the preceding aspects, the oscillator circuit also includes a third capacitor formed on the semiconductor substrate, a third inductor formed on the semiconductor substrate, a fourth capacitor formed on the semiconductor substrate, and a fourth inductor formed on the semiconductor substrate. The third capacitor, the third inductor, the fourth capacitor, and the fourth inductor are connected with the first capacitor, the first inductor, the second capacitor, and the second inductor in the ring configuration with each capacitor connected between a pair of the inductors and each inductor connected between a pair of the capacitors.

According to one other aspect of the present disclosure, there is provided a method of generating an oscillator signal comprising: receiving an electrical signal from a resonant tank, the resonant tank including a first capacitor formed on a semiconductor substrate, a first inductor formed on the semiconductor substrate, a second capacitor formed on the semiconductor substrate, and a second inductor formed on the semiconductor substrate. The first capacitor, the first inductor, the second capacitor, and the second inductor are connected in series in a ring configuration with each capacitor connected in series between inductors and each inductor connected in series between capacitors. The method also includes amplifying the electrical signal from the resonant tank and providing an amplified electrical signal back to the resonant tank to generate the oscillator signal at a resonant frequency of the resonant tank.

Optionally, in any of the preceding aspects, amplifying the electrical signal is performed using one or more pairs of inverters.

Optionally, in any of the preceding aspects, the first inductor and the second inductor are tapped inductors each having at least one tapped terminal at an intermediate location between inductor ends, and providing the amplified electrical signal back to the resonant tank includes providing inverted amplified signals at tapped terminals of the first and second inductors.

Optionally, in any of the preceding aspects, the method further includes controlling a capacitance of at least the first capacitor to control the resonant frequency and thereby control frequency of the oscillator signal.

Optionally, in any of the preceding aspects, the method further includes obtaining a carrier signal in a transceiver of in a communications system from the oscillator signal.

Optionally, in any of the preceding aspects, obtaining the carrier signal in the transceiver includes performing phase comparison and filtering in a Phase Locked Loop (PLL).

According to still one other aspect of the present disclosure, there is provided a Voltage Controlled Oscillator (VCO), comprising: a resonant tank; a first inverter; and a second inverter. The resonant tank includes: a first capacitor formed on a semiconductor substrate; a second capacitor formed on the semiconductor substrate; a first inductor formed on the semiconductor substrate, the first inductor having a first tapped terminal, the first inductor connected between a first terminal of the first capacitor and a first terminal of the second capacitor; a second inductor formed on the semiconductor substrate, the second inductor having a second tapped terminal, the second inductor connected between a second terminal of the first capacitor and a second terminal of the second capacitor such that the first capacitor, the first inductor, the second capacitor, and the second inductor form a ring. The first inverter has an input connected to the first terminal of the first capacitor and an output connected to the first tapped terminal. The second inverter has an input connected to the second terminal of the first capacitor and an output connected to the second tapped terminal.

Optionally, in any of the preceding aspects, at least one of the first capacitor and the second capacitor is a variable capacitor having a variable capacitance controlled to select a resonant frequency of the resonant tank.

Optionally, in any of the preceding aspects, the VCO is connected to a phase detector, a filter, and a feedback loop in a Phase Locked Loop (PLL) arrangement to provide an oscillator signal of a transceiver.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures (FIGS.) for which like references indicate elements.

FIGURE (FIG. 1 illustrates an exemplary wireless network for communicating data.

FIG. 6 illustrates an example of a PLL included in in a UE or a BS shown in FIGS. 2 and 3 as illustrated in FIGS. 4 and 5.

FIGS. 7A-F illustrate examples of VCOs included in the PLL of FIG. 6.

FIGS. 8A-C illustrate an example of an LC tank that may be included in the VCOs of FIGS. 7A-B.

FIGS. 9A-D illustrate another example of an LC tank that may be included in the VCOs of FIGS. 7A-B.

FIG. 12 illustrates an implementation of an LC tank with more than two capacitors and more than two inductors in a ring configuration that may be used in the VCOs of FIGS. 7A-B.

FIG. 13 illustrates a high level flow diagram that is used to summarize various methods of operating a resonant tank, such as the LC tanks of FIGS. 9A-12.

DETAILED DESCRIPTION

The present disclosure will now be described with reference to the figures, which in general relate to Voltage Controlled Oscillator (VCO) circuits that include an inductor-capacitor (LC) resonant tank.

A resonant tank in an oscillator circuit such as a VCO may be formed by a capacitor and an inductor. In general, as device dimensions shrink, breakdown voltages become smaller and lower voltages may be used in order to avoid breakdown. However, lower voltages may result in lower signal to noise ratio (SNR) and lower Quality Factor (Q factor) in some circuits, including circuits used in user equipment in a communications system. In order to maintain SNR at a given frequency while reducing voltage, capacitor size may be increased while inductor size is reduced. However, this approach is not always feasible. Devices with m is-matched sizes may be difficult or impossible to physically connect at some scale.

A resonant tank formed by a multi-element ring of capacitors and inductors may allow the use of lower voltages, while maintaining an acceptable SNR, and while maintaining relative sizes of capacitors and inductors within an acceptable range. For example, two capacitors and two inductors may be coupled together in an alternating ring configuration. For the same voltage as a single-capacitor, single-inductor resonant tank, such a two-capacitor, two-inductor resonant tank may store approximately double the energy and may provide a signal with approximately double the SNR. Using half the voltage as used in a single-capacitor, single-inductor resonant tank, such a two-capacitor, two-inductor resonant tank may store approximately the same amount of energy and may provide a signal with approximately the same SNR thus facilitating acceptable SNR as devices shrink and voltages are reduced.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
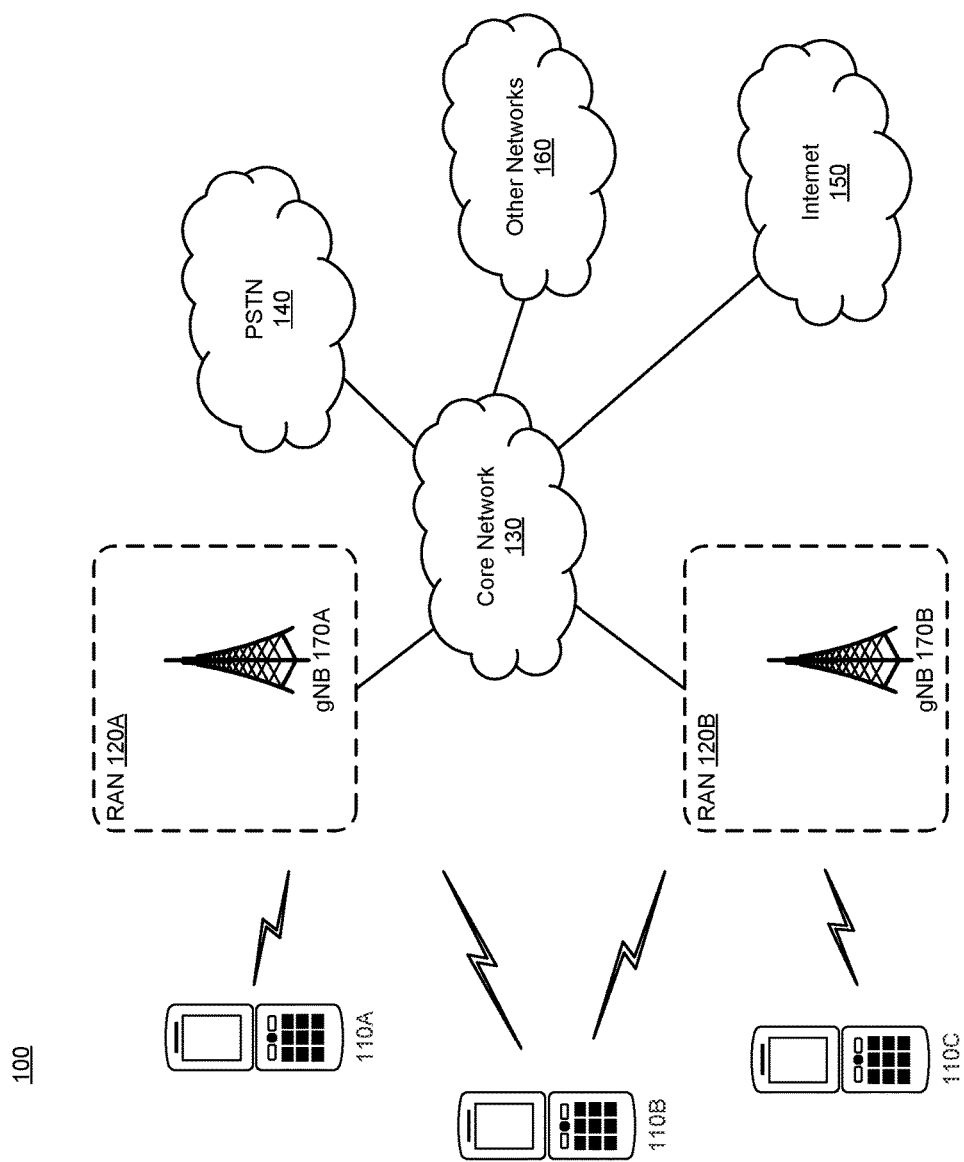

FIG. 1 illustrates a wireless network for communicating data. The communication system 100 includes, for example, user equipment 110A-110C, radio access networks (RANs) 120A-120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A-110C are configured to operate and/or communicate in the system 100. For example, the user equipment 110A-110C are configured to transmit and/or receive wireless signals or wired signals. Each user equipment 110A-110C represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A-120B include one or more base stations 170A, 170B (collectively, base stations 170), respectively. Each of the base stations 170 is configured to wirelessly interface with one or more of the UEs 110A, 110B, 110C to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the base station 170A forms part of the RAN 120A, which may include other base stations, elements, and/or devices. Similarly, the base station 170B forms part of the RAN 120B, which may include other base stations, elements, and/or devices. Each of the base stations 170 operates to transmit and/or receive wireless signals within a particular geographic region or area, sometimes referred to as a "cell." In some embodiments, multiple-input multiple-output (MIMO) technology may be employed having multiple transceivers for each cell.

The base stations 170 communicate with one or more of the user equipment 110A-110C over one or more air interfaces (not shown) using wireless communication links. The air interfaces may utilize any suitable radio access technology.

It is contemplated that the system 100 may use multiple channel access functionality, including for example schemes in which the base stations 170 and user equipment 110A-110C are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120A-120B are in communication with the core network 130 to provide the user equipment 110A-110C with voice, data, application, Voice over Internet Protocol (VoIP), or other services. As appreciated, the RANs 120A-120B and/or the core network 130 may be in direct or indirect communication with one or more other RANs (not shown). The core network 130 may also serve as a gateway access for other networks (such as PSTN 140, Internet 150, and other networks 160). In addition, some or all of the user equipment 110A-110C may include functionality for communicating with different wireless networks over different wireless links using different wireless technologies and/or protocols.

The RANs 120A-120B may also include millimeter and/or microwave access points (APs). The APs may be part of the base stations 170 or may be located remote from the base stations 170. The APs may include, but are not limited to, a connection point (an mmW CP) or a base station 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

Figure 2:
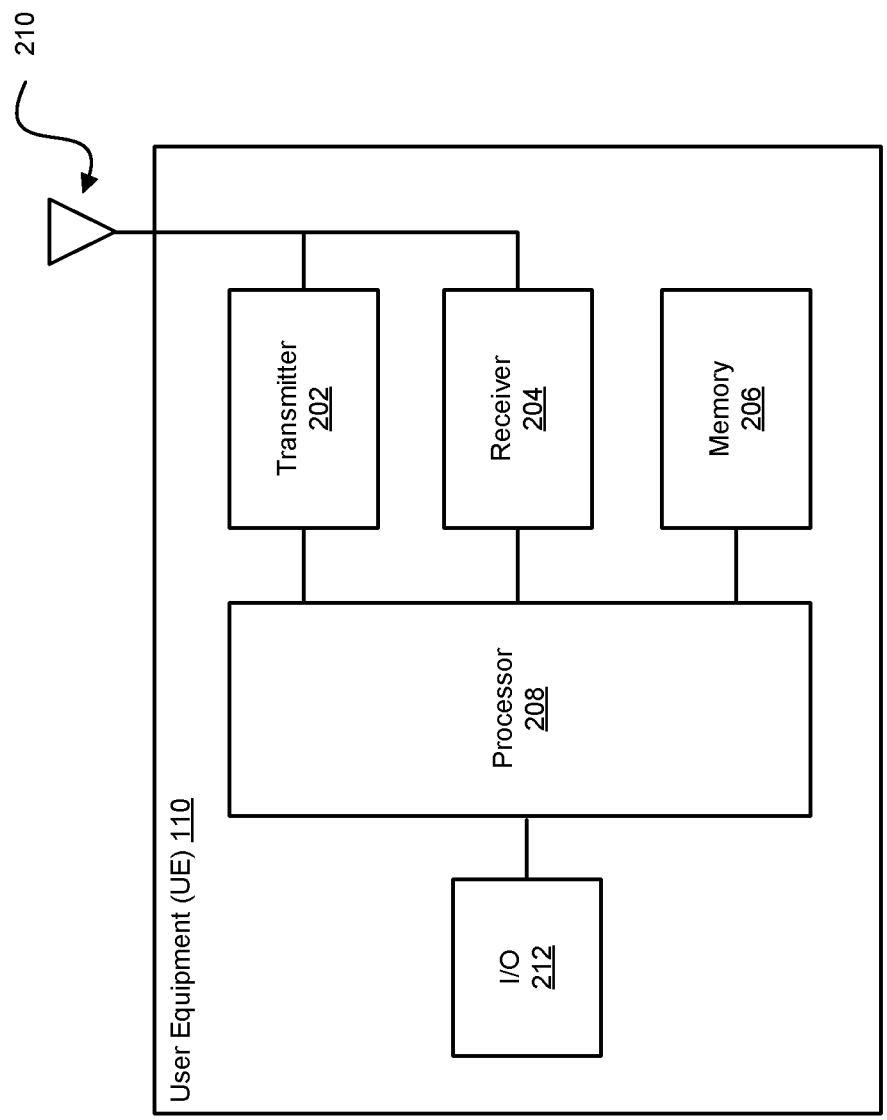
FIG. 2 illustrates exemplary details of an instance of user equipment (UE) introduced in FIG. 1.

FIG. 2 illustrates example details of an UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 3:
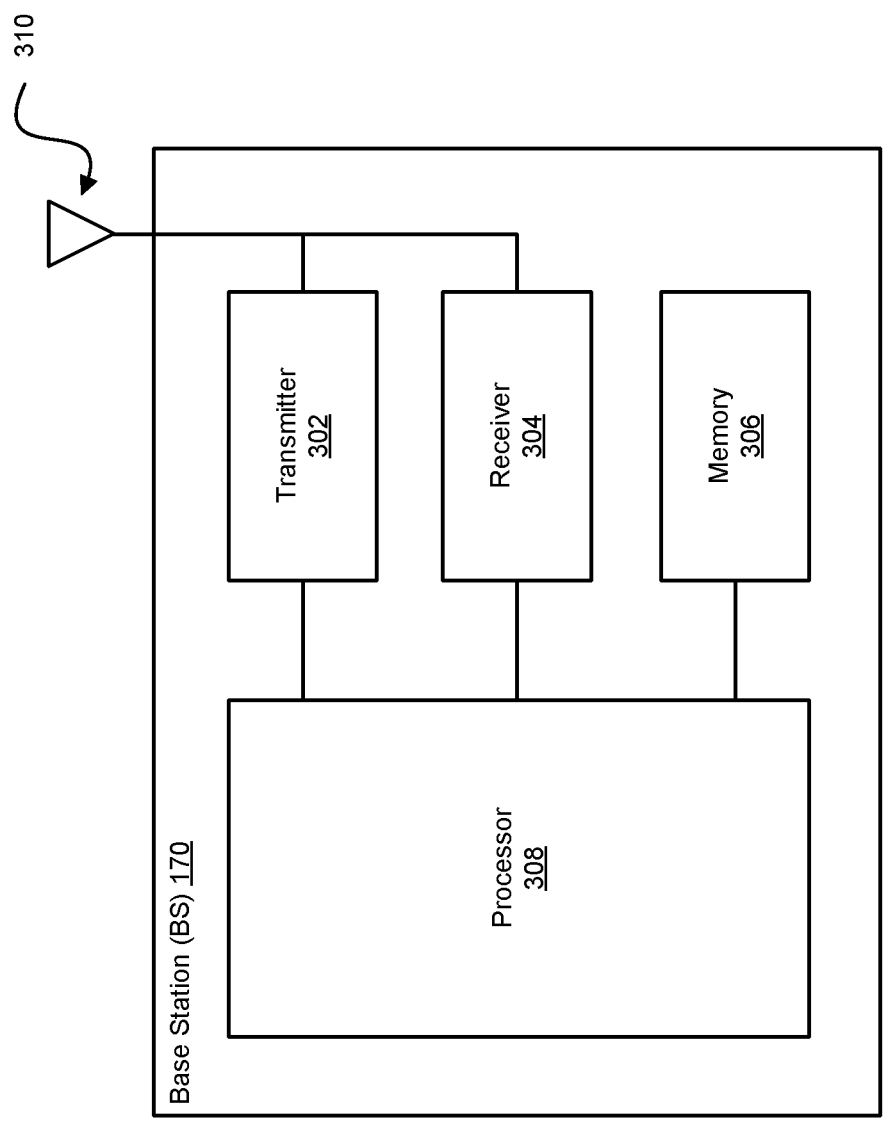
FIG. 3 illustrates exemplary details of an instance of a base station (BS) introduced in FIG. 1.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

The technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

Figure 4:
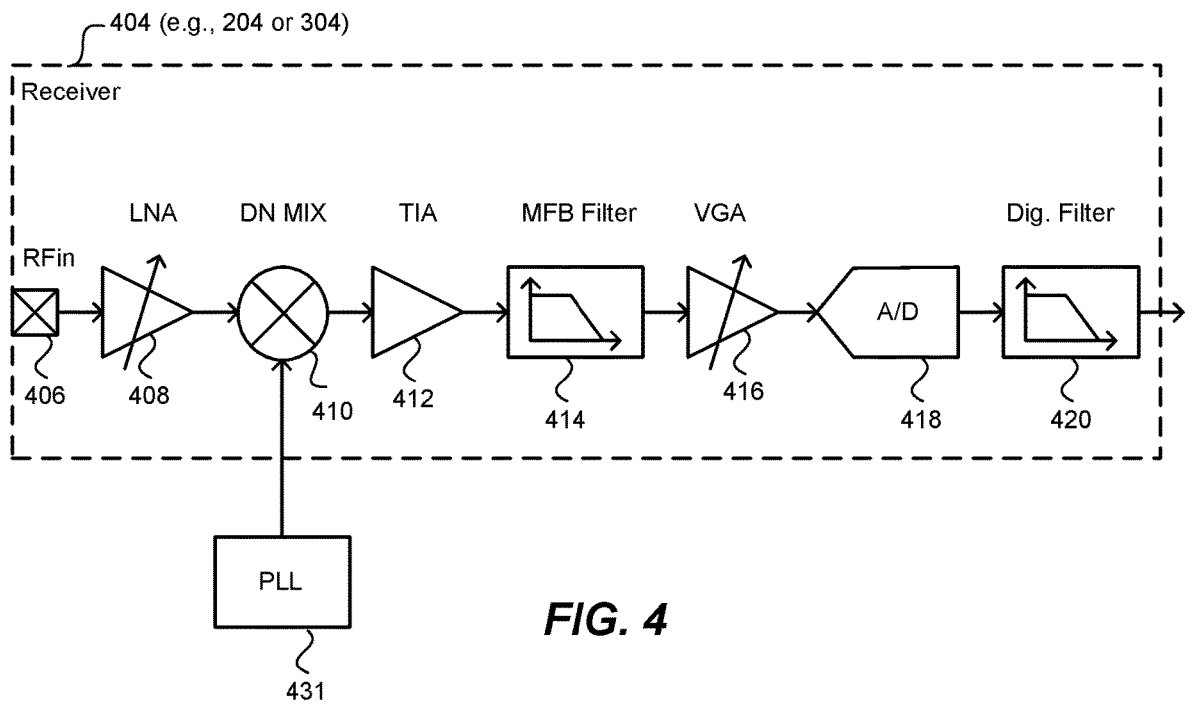
FIG. 4 illustrates exemplary details of a receiver included in a UE or a BS shown in FIGS. 2 and 3.

FIG. 4 illustrates exemplary details of a receiver 404, which can be the receiver 204 included in the UE 110 (shown in FIG. 2) or the receiver 304 included in the BS 170 (shown in FIG. 3), but is not limited thereto. Referring to FIG. 4, the receiver 404 is shown as including an input 406 at which is received a radio frequency (RF) signal, and thus, the input 406 can also be referred to as the RF input 406. The RF input 406 can be coupled to an antenna or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR). The amplified RF signal that is output by the LNA 408 is provided to a mixer 410. The mixer 410, in addition to receiver the amplifier RF signal from the LNA 408, also receives an oscillator signal from a local oscillator, which in this case is a Phase Locked Loop (PLL) 431. Mixer 410 adjusts the frequency of the amplifier RF signal, e.g., from a first frequency to a second frequency that is lower than the first frequency. More specifically, the mixer 410 can be a down-mixer (DN MIX) that frequency down-converts the amplified RF signal from a relatively high frequency to a baseband frequency, or an intermediate frequency (IF) that is offset from the baseband frequency. Thus, an oscillator signal from PLL 431 is used as a carrier signal in receiver 404.

Still referring to FIG. 4, the frequency down-converted RF signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MBF filter 414 low pass filters the frequency down-converted RF signal, to filter out high frequency signal components that are not of interest, such as high frequency (HF) noise. The filtered RF signal that is output from the MBF filter 414 is provided to a variable gain amplifier (VGA), which is used to amplify the RF signal before it provided to an analog-to-digital converter (ND) 418, which converts the RF signal from an analog signal to a digital signal. The digital signal output from the ND 418 is then provided to a digital filter 420, which performs additional filtering to remove out of band signal components and attenuates quantization energy from the ND 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

Figure 5:
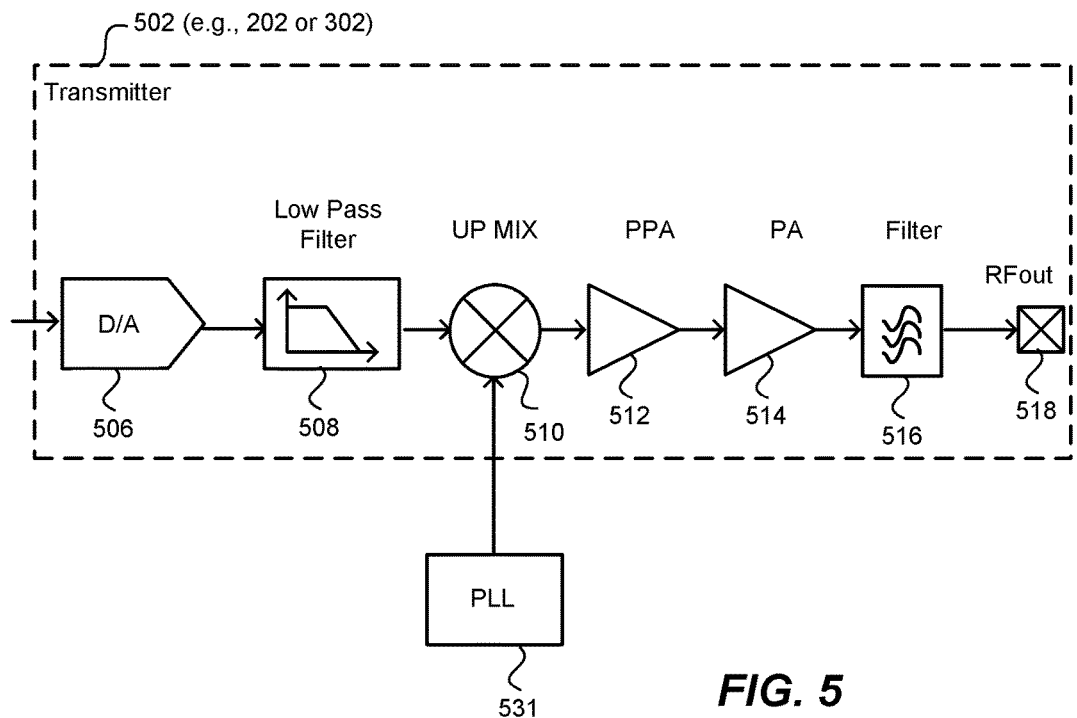
FIG. 5 illustrates exemplary details of a transmitter included in a UE or a BS shown in FIGS. 2 and 3.

FIG. 5 illustrates exemplary details of a transmitter 502, which can be the transmitter 202 included in the UE 110 (shown in FIG. 2) or the transmitter 302 included in the BS 170 (shown in FIG. 3) but is not limited thereto. Referring to FIG. 5, the transmitter 502 is shown as including a Digital-to-Analog Converter (D/A) 506, which converts a digital input (e.g. from processor 208 or processor 308) into an analog RF signal and provides the RF signal to a Low Pass Filter 508, which filters the RF signal and provides the filtered RF signal to mixer 510. Mixer 510, in addition to receiving the filtered RF signal from Low Pass Filter 508, also receives a local oscillator signal from PLL 531 and adjusts the frequency of the RF signal, e.g. from a first frequency to a second frequency that is higher than the first frequency. More specifically, mixer 510 may be an up-mixer (UP MIX) that frequency up-converts the filtered RF signal from a relatively low frequency (e.g. baseband frequency, or an intermediate frequency (IF) that is offset from the baseband frequency) to a relatively high frequency. Thus, an oscillator signal from PLL 531 is used as a carrier signal in transmitter 502. The RF signal from mixer 510 is then amplified by a Pre-Power Amplifier (PPA) 512, and a Power Amplifier (PA) 514 and filtered by a filter 516 before being provided to an RF output 518 (RFout). For example, RF output 518 may be coupled to an antenna or a coupler but is not limited thereto.

FIG. 6 shows a schematic illustration of a PLL 631 (e.g. PLL 431 of FIG. 4 or PLL 531 of FIG. 5), which may be used to provide a local oscillator signal for a transmitter (e.g. for transmitter 202 or transmitter 302) or for a receiver (e.g. for a receiver in user equipment or in a base station, such as receiver 204 or receiver 304) or for any other purpose. PLL 531 may be incorporated into a common IC or a set of ICs with a receiver and/or transmitter (e.g. receiver 404 and/or transmitter 502) which may be packaged e.g. using flip-chip or metal bumping to form connections to such ICs without using bond wires. A transmitter, receiver, or transceiver IC may include multiple PLLs to generate oscillator signals, which can be used as carrier signals, but are not limited thereto.

PLL 631 includes a Phase Detector 640, which receives an input signal (e.g. a signal from a master oscillator) and a feedback signal via a feedback loop through a Frequency Divider 642 from the output of PLL 631 (frequency divider 642 may be considered optional according to the relationship between an input frequency and output frequency). Phase Detector 640 compares the input frequency and feedback frequency and generates an output according to the phase comparison, which is provided to Low Pass Filter 644. Low Pass Filter 644 removes high-frequency noise to generate a Direct Current (DC) output according to the difference between the input frequency and the feedback frequency. The DC output is provided to Voltage Controlled Oscillator, VCO 646, which adjusts the frequency of its output signal according to the voltage it receives from Low Pass Filter 644 in order to bring its output signal back to the frequency of the input signal. Thus, the PLL provides an output with a frequency that locks onto the input frequency.

Figure 7D:
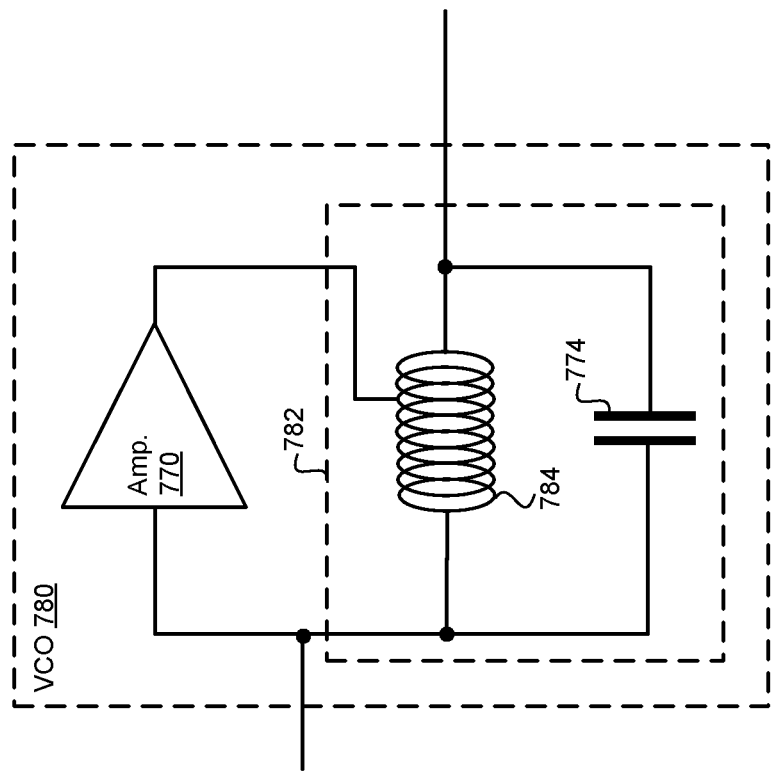

FIG. 7A shows an example of an implementation of a VCO 746 (e.g. VCO 646 of FIG. 6 used in PLL 631) to provide a local oscillator signal for a receiver (such as receiver 404) or a transmitter (such as transmitter 502). VCO 746 includes a resonant tank 748 and an amplifier 750 coupled to provide an electrical input to the resonant tank and amplify an electrical signal in resonant tank 748. A control signal 752 (e.g. a DC voltage from a phase detector and low pass filter in a PLL) is provided to resonant tank 748 to allow adjustment of a resonant frequency of the tank and thus the frequency of an output signal 754. Control signal 752 may modify resonant frequency by changing characteristics of one or more component of resonant tank 748. For example, in a resonant tank that includes a capacitor and an inductor ("an LC resonant tank", or simply "an LC tank"), the capacitance of the capacitor may be modified according to a control signal (e.g. capacitor may be a variable capacitor that has a variable capacitance, which can be varied according to the control signal).

In some cases, an LC tank may include an inductor which may be tapped so that it has more than two terminals. For example, a tapped inductor may include one or more tapped terminals at intermediate locations between inductor ends (i.e. between end terminals of an inductor). FIG. 7B shows an example of a VCO 760, in which LC tank 762 includes a capacitor controlled by control signal 768 and a tapped inductor that includes two tapped terminals in addition to two terminals at either end of the inductor. End terminals of an inductor of tapped LC tank 762 may be connected to inputs of amplifier 764 while tapped terminals of the inductor of tapped LC tank 762 may be connected to outputs of amplifier 764, one of which is provided as output signal 766. This may provide certain advantages. For example, an input signal from LC tank 762 to amplifier 764 may exceed the supply voltage restrictions of amplifier 764. Since the input voltage is representative of the energy stored in tapped LC tank 762, the VCO noise in VCO 760 may be lower for the same total inductance than a VCO using an untapped inductor (i.e. because the LC circuit voltage is higher). A tapped inductor may provide a better SNR and higher Q value than a corresponding untapped inductor of the same size. Since the input voltage to amplifier 764 may exceed the power supply rails, the gain of amplifier 764 may be higher for a given power consumption. A detailed description of use of tapped inductors in a VCO is provided in U.S. Pat. No. 9,425,737, entitled "Tapped inductor voltage controlled oscillator," which is hereby incorporated by reference in its entirety.

Amplifiers such as amplifiers 750 and 764 that are used in a VCO may be single ended amplifiers or differential amplifiers and both single ended and differential amplifiers may be used with tapped or untapped inductors. While a single ended amplifier has one input and one output, a differential amplifier has two inputs and two outputs. Both single ended and differential amplifiers may be inverting or non-inverting.

Figure 7C:
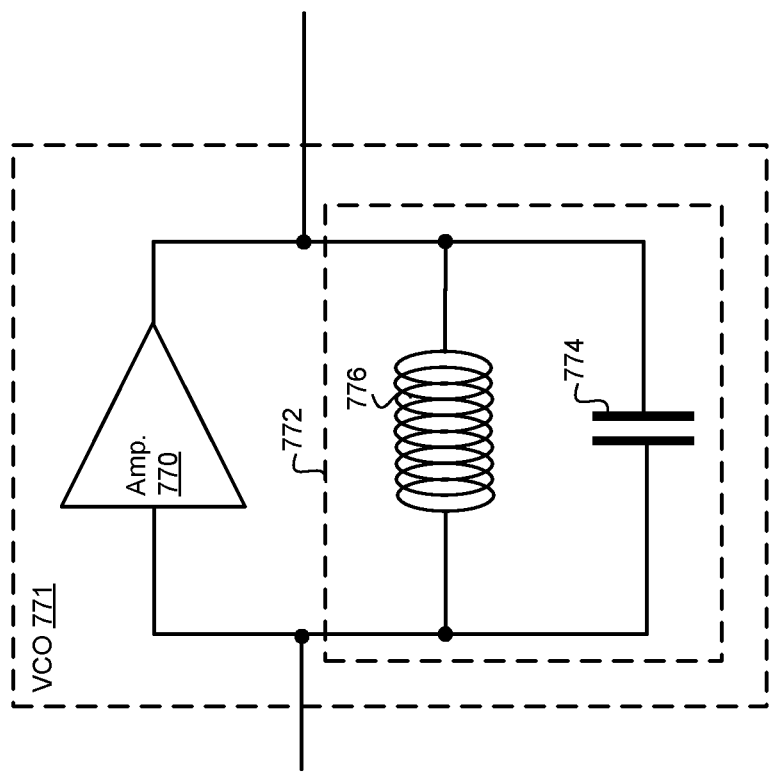
Figure 7F:
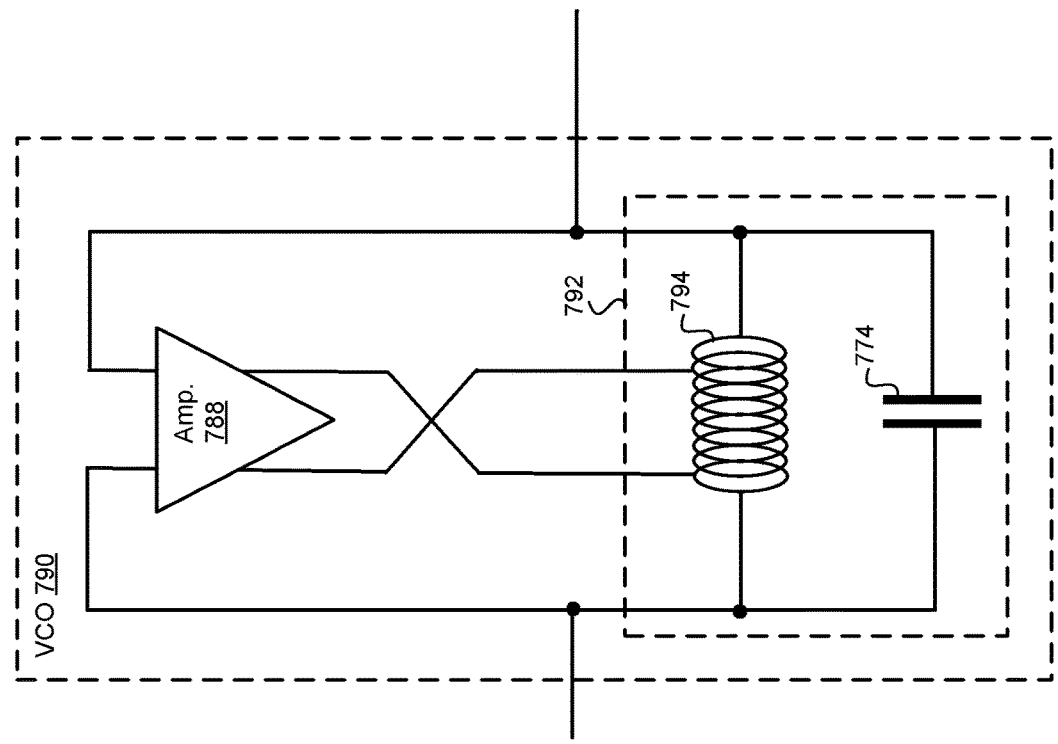
Figure 7E:
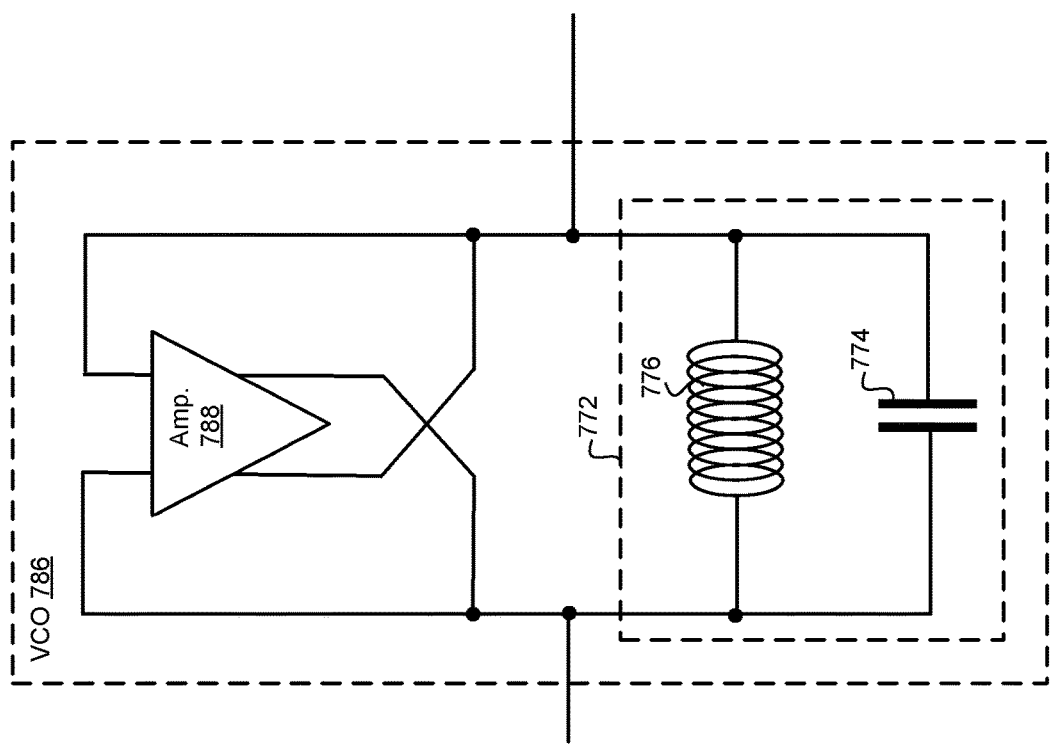

For example, FIG. 7C shows an example of a VCO 771 that includes a single ended amplifier 770 connected to a resonant tank 772, which includes capacitor 774 and untapped inductor 776. FIG. 7C shows an example of a VCO 780 that includes single ended amplifier 770 connected to a resonant tank 782, which includes capacitor 774 and tapped inductor 784. FIG. 7E shows an example of a VCO 786 that includes a differential amplifier 788 connected to resonant tank 772, which includes capacitor 774 and untapped inductor 776. FIG. 7F shows an example of a VCO 790 that includes differential amplifier 788 connected to a resonant tank 792, which includes capacitor 774 and tapped inductor 794, which in this example has two tapped terminals.

FIG. 8A illustrates an example of a simple schematic of an LC tank 848 that may be used in a VCO, e.g. as resonant tank 748 of VCO 746. LC tank 848 includes a capacitor 850 and an inductor 852 connected in parallel. Capacitor 850 may be a variable capacitor that is controlled by a control signal (not shown in FIG. 8A) to control the resonant frequency of LC tank 848. Output terminals 854, 856 of LC tank 848 may be connected to an amplifier (such as amplifier 750) and the voltage, V, across output terminals 854, 856 is shown in FIG. 8B. It can be seen that the voltage is in the form of a sine wave in this example. The frequency of this signal, w, is the resonance frequency of LC tank 848 and depends on inductance (L) and capacitance (C) according to the following equation:

$$\omega = \frac{1}{\sqrt{LC}}$$

In general, the Signal to Noise Ratio (SNR) and Q factor of an output signal from an LC tank depends on the energy stored in the tank. The energy depends on the capacitance (C), inductance (L), voltage (V), and current (I) according to the equation:

$$E = \frac{1}{2}CV^2 = \frac{1}{2}LI^2$$

To increase energy E and improve signal strength of a VCO at a fixed supply voltage and fixed frequency, the capacitor may be made larger while the inductor may be made smaller to reduce impedance and facilitate larger current. Similarly, to maintain the same energy and signal strength as voltage is reduced, the inductor may be made smaller while the capacitor is made larger. Thus, the relative sizes of a capacitor and an inductor in an LC tank may change as voltage is reduced (e.g. to facilitate smaller devices with lower breakdown voltages).

FIG. 8C shows an example of a physical implementation of LC tank 848 formed on a semiconductor substrate 860. Inductor 852 is formed as a loop of metal formed on semiconductor substrate 860, e.g. deposited in a blanket layer, patterned, and etched to form the loop shown. Capacitor 850 may be formed of one or more capacitive elements that are formed by depositing layers of conductive material separated by a dielectric layer. While reducing inductor size and increasing capacitor size may work for a range of voltages to give adequate SNR, there may be physical limits on forming connections between components as component sizes change. For example, it may be difficult to form a small enough loop of metal and to connect it to terminals of a large capacitor for high frequencies (e.g. 12 GHz).

In general, an LC tank such as LC tank 848 stores energy and loses energy. If energy is added faster than it is lost, the signal will increase in power and amplitude. As the signal increases losses usually increase as well, therefore a stable limit cycle occurs where the energy added equals the energy lost. In some cases, an oscillator may start with no external stimulation signal provided since an inductor always has some resistance and the random motion of electrons in such an inductor provides Gaussian noise distributed across all frequencies. As the LC tank filters the noise, it shows a peak in the noise spectrum at the resonant frequency. When an amplifier is attached to such an LC tank (e.g. as shown in the examples of FIGS. 7A-F) it amplifies that peak noise and adds it to the energy of the resonant tank. This way an oscillator may start without any externally provided electrical stimulation, other than the noise present in the components of the LC tank themselves. Because the noise is of very low level it generally requires some time for an oscillator to reach its full amplitude. Therefore, in some cases, an electrical input, or external stimulation signal, is applied to reduce the time required to reach full amplitude. Aspects of the present technology are applicable to implementations both with and without such stimulation signals.

FIG. 9A shows an alternative example of resonant tank in schematic form, LC tank 948, that may be used in a VCO, e.g. as resonant tank 748 of VCO 746 of FIG. 7A. LC tank 948 includes two capacitors, capacitor 970 and capacitor 972, and two inductors, inductor 974 and inductor 976, in a ring configuration with each capacitor connected between a pair of the inductors (i.e. capacitor 970 is connected between inductor 974 and inductor 976, and so is capacitor 972), and with each inductor connected between a pair of the capacitors (i.e. inductor 974 is connected between capacitor 970 and capacitor 972, and so is inductor 976). LC tank 948 may be considered an example of a multi-element LC tank, or multi-element resonator.

LC tank 948 provides certain advantages over LC tank 848. For example, for the same voltages across components in LC tank 848 and LC tank 948, and the same sized components, LC tank 948 may store more energy and thus provide a higher SNR. The resonant frequency, w, of LC tank 948 depends on the inductance (L) of individual inductors 974, 976 and the capacitance (C) of individual capacitors 970, 972 according to the following equation:

$$\omega = \frac{1}{\sqrt{(2L)\left(\frac{C}{2}\right)}} = \frac{1}{\sqrt{LC}}$$

Thus, resonant frequency is the same as for LC tank 848 when components of equal size are used. The energy stored in LC tank 948 is twice the energy E stored in LC tank 848 (i.e. each capacitor and inductor stores the same as in LC tank 848, and there are twice as many capacitors and inductors). This energy, 2E, depends on the capacitance (C), inductance (L), voltage (V), and current (I) according to the equation:

$$2E = \frac{1}{2}\left(\frac{C}{2}\right)(2V)^2 = \frac{1}{2}(2L)I^2$$

Thus, for the same voltage, twice as much energy is stored and SNR may be improved compared with LC tank 848. Or, energy and SNR may be kept at the same levels as for LC tank 848 while using a lower voltage (e.g. half the voltage to maintain same energy and SNR). Some combination of increased SNR and reduced voltage may be used to obtain multiple benefits.

FIGS. 9B and 9C show voltages at different locations of LC tank 948 of FIG. 9A. FIG. 9B shows voltage V1 between terminal 980 and terminal 982 as a function of time, while FIG. 9C shows voltage V2 between terminal 984 and terminal 986 as a function of time. FIGS. 9B and 9C show similar periodic signals that are out of phase (180 degrees out of phase in this example). Voltage V1 and/or V2 may be used to provide an output signal of LC tank 948 (and an output signal of a VCO that includes LC tank 948). In order to allow tuning of LC tank 948, capacitor 970 and/or capacitor 972 may be variable (i.e. may configured to have different capacitances) so that the output of LC tank 948 can be modified (e.g. according to a reference signal in a PLL).

FIG. 9D illustrates an example of a physical implementation of LC tank 948 of FIG. 9A formed on a semiconductor substrate 960. Inductor 974 is formed as a portion of metal on semiconductor substrate 960, e.g. deposited in a blanket layer, patterned, and etched to form the partial loop shown. Inductor 976 is similarly formed as a portion of metal on semiconductor substrate 960. In an example, inductors in an LC tank may be formed of portions of metal that are half-loops (e.g. inductor 974 may form half of a loop and inductor 976 may form the other half of the loop with breaks in the loop for capacitors). Capacitors 970, 972 may be formed of one or more capacitive elements that are formed by depositing layers of conductive material separated by a dielectric layer.

Amplification of a signal in an LC tank may be provided by one or more amplifiers connected to components of the LC tank in order to add energy and thus overcome energy loss from lossy elements of the LC tank. For an LC tank with a single capacitor in parallel with a single inductor, amplification may be provided across the capacitor and inductor. In an LC tank with two or more capacitors and two or more inductors such as LC tank 948 amplification can be provided at different locations and in different configurations as appropriate.

Figure 10B:
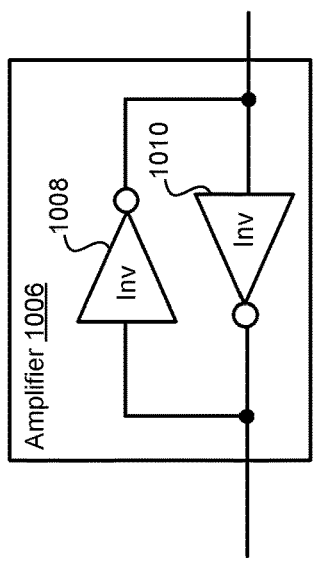
FIGS. 10A-D illustrate implementations of the LC tank of FIGS. 9A-D in a VCO such as the VCOs of FIGS. 7A-B.
Figure 10C:
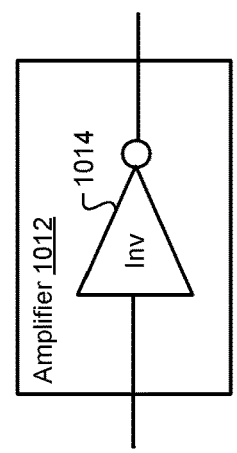
Figure 10A:
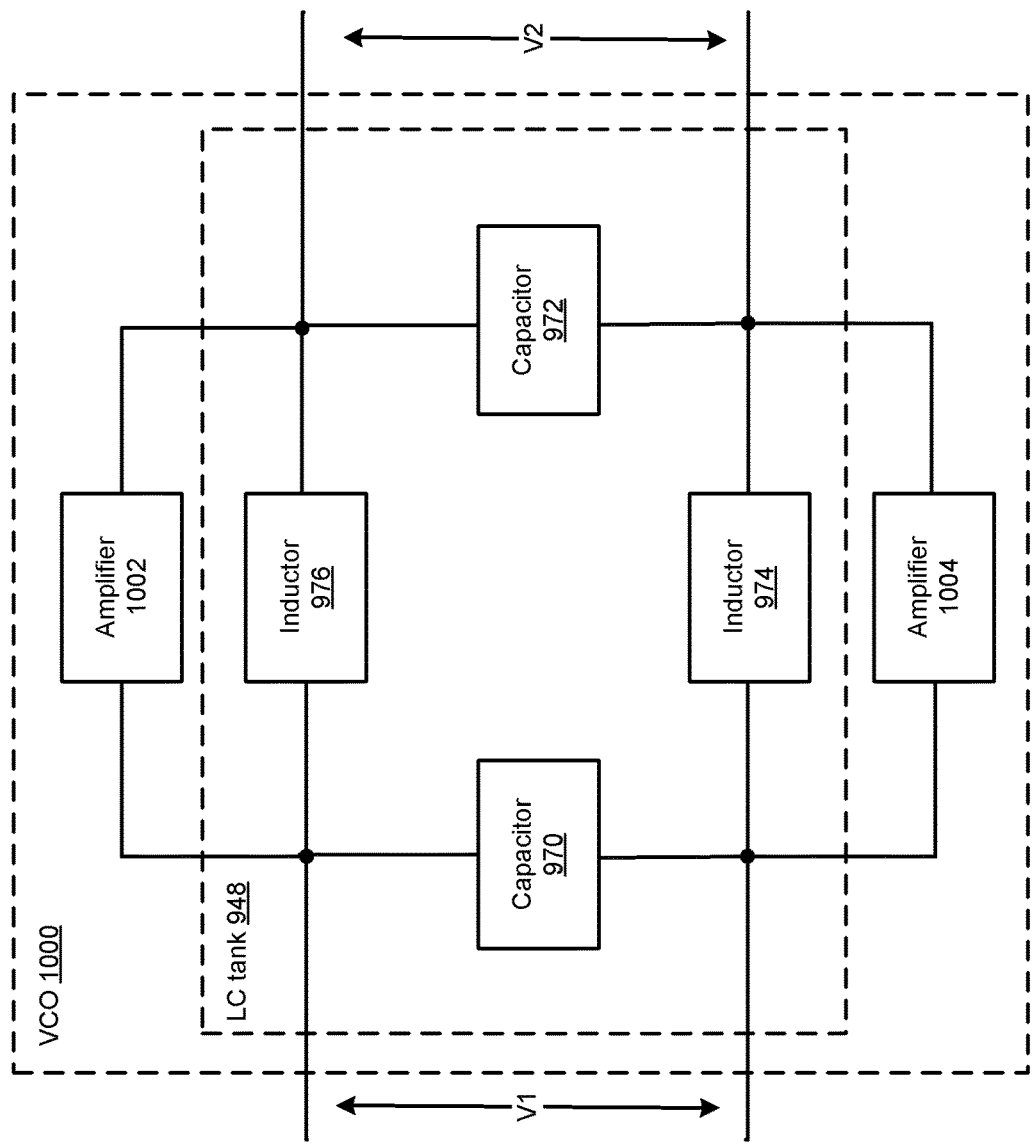

FIG. 10A shows an example of a VCO 1000 including LC tank 948 of FIG. 9A with amplifier 1002 coupled to provide amplification across inductor 976 and amplifier 1004 coupled to provide amplification across inductor 974. Amplifiers 1002, 1004 may be formed of any suitable circuits configured to amplify a signal in LC tank 948. Amplifiers 1002 and 1004 may be considered collectively as an example implementation of amplifier 750 of VCO 746 and may provide electrical input to LC tank 948 and amplify an electrical signal to generate an oscillator signal at the resonant frequency of LC tank 948.

FIG. 10B shows an example of an amplifier 1006 that may be used with an LC tank such as LC tank 948 of FIG. 10A (i.e. amplifier 1006 may be used as amplifier 1002 and/or amplifier 1004). Amplifier 1006 is formed of a differential inverter pair consisting of inverter 1008 and inverter 1010, that are oppositely oriented. In this configuration, amplifier 1006 can provide amplification in both directions, in both phases of a signal in LC tank 948.

FIG. 10C shows another example of an amplifier 1012 that may be used with an LC tank such as LC tank 948 of FIG. 10A (i.e. amplifier 1012 may be used as amplifier 1002 and/or amplifier 1004). Amplifier 1012 is formed of an inverter 1014. In this configuration, amplifier 1012 provides amplification in only one direction, in one phase of a signal in LC tank 948.

Capacitors in an LC tank may be variable capacitors that are formed of two or more capacitive elements that are configurable to vary capacitance. In an LC tank with more than one capacitor, one or more capacitors may be variable capacitors to allow tuning of the resonant frequency of the LC tank.

Figure 10D:
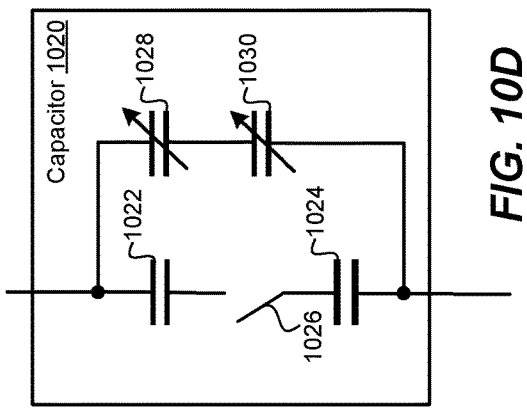

FIG. 10D shows a schematic illustration of a variable capacitor, capacitor 1020, that may be used in an LC tank such as LC tank 948 of FIG. 10A (e.g. capacitor 1020 may be used as capacitor 970 and/or capacitor 972). Capacitor 1020 includes a first capacitive element 1022 and a second capacitive element 1024 with a switch 1026 to modify capacitance of capacitor 1020 by a discrete amount according to connection of first capacitive element 1022 and the second capacitive element 1024. Specifically, the first capacitive element 1022 and second capacitive element 1024 may be inactive (providing no contribution to capacitance of capacitor 1020) when switch 1026 is open or may be active (contributing to capacitance of capacitor 1020) when switch 1026 is closed. FIG. 10D also shows variable capacitive element 1028 and variable capacitive element 1030 each with a respective capacitance that is variable over a continuous range according to an applied voltage. For example, variable capacitive elements 1028, 1030 may be varactors with capacitance varying according to applied voltage. While two variable capacitive elements 1028, 1030 are shown in capacitor 1020, any number of variable capacitive elements may be provided. And while a single switch is shown controlling coupling of capacitive element 1022 and capacitive element 1024, it will be understood that a variable capacitor may include any number of capacitive elements in any suitable configuration (e.g. an array or bank of capacitive elements and switches). A variable capacitor may include capacitive elements that are configurable by switches (e.g. capacitive elements 1022 and 1024, which are configurable by switch 1026) and/or variable capacitive elements that are configurable to allow their capacitance to be modified (e.g. variable capacitive elements 1028, 1030). Switch 1026 and variable capacitive elements may be controlled to change capacitance of capacitor 1020 by discrete amounts and/or over a continuous range. A switch such as switch 1026 may be formed of any suitable component or components. For example, one or more transistor may be used as a switch that is configurable to connect or disconnect components. Any suitable components which can connect and disconnect circuit nodes may be used as switches. In this way, course and fine adjustment of capacitance allows precise adjustment of resonant frequency, e.g. in response to a voltage from a phase detector in a PLL.

In an LC tank with two or more capacitors (e.g. capacitors 970 and 972 of LC tank 948) one or more capacitor may be a variable capacitor. In a symmetric implementation of LC tank 948, capacitor 970 and capacitor 972 are variable capacitors, e.g. as illustrated in FIG. 10D. Amplification may be symmetric in such an implementation so that both amplifier 1002 and amplifier 1004 may be formed by pairs of inverters as illustrated in FIG. 10B. Output voltages V1 and V2 in this configuration may be symmetric with a phase difference of 180 degrees.

While FIG. 10A shows an example in which amplifiers 1002 and 1004 are connected across inductors 976 and 974 respectively, other amplifier to inductor configurations are possible. For example, some inductors may be tapped inductors with one or more tapped terminals (in addition to terminals at either end). Tapped inductors may have connections to their tapped terminals in addition to their end terminals at inductor ends.

Figure 11B:
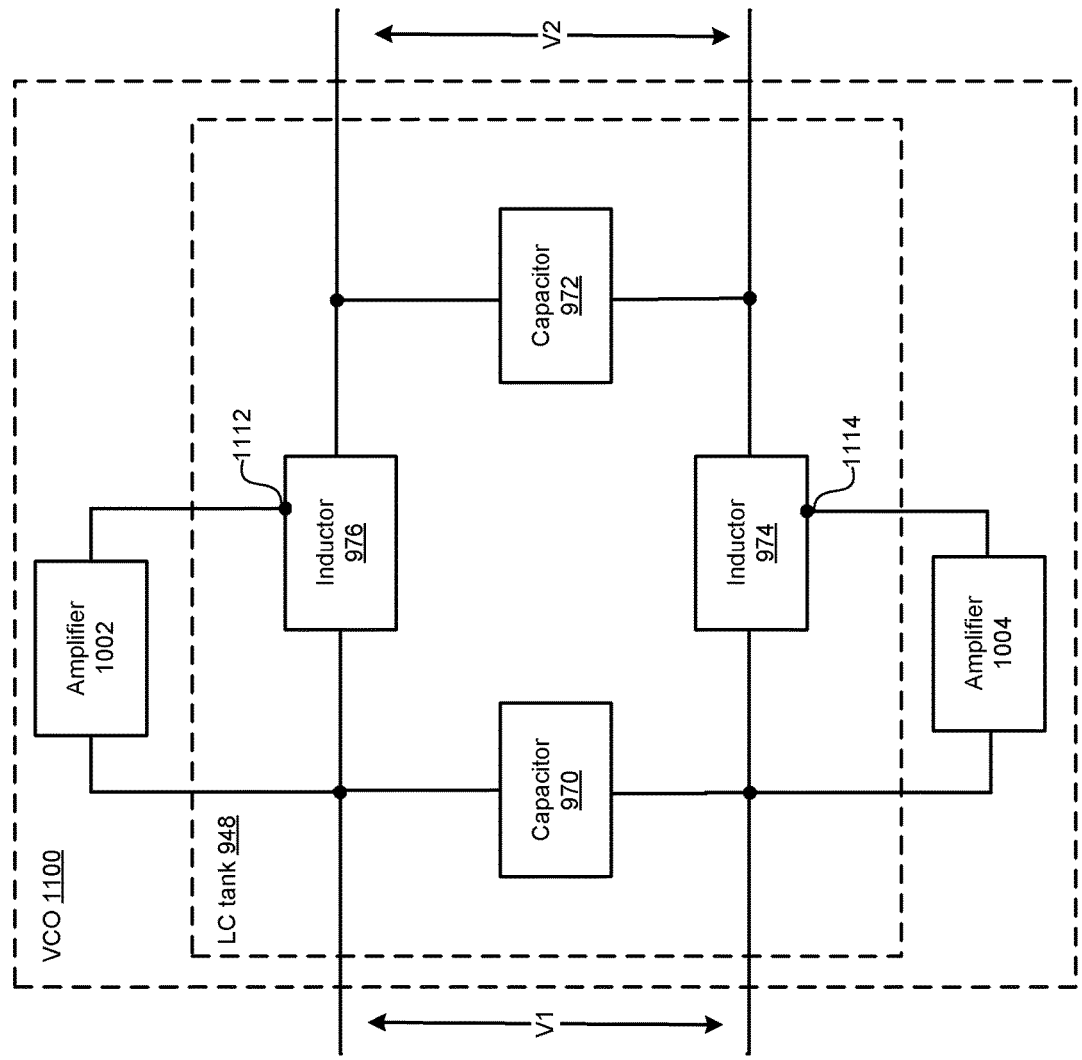
FIGS. 11A-C illustrate implementations of the VCOs of FIGS. 7A-B using tapped inductors.
Figure 11A:
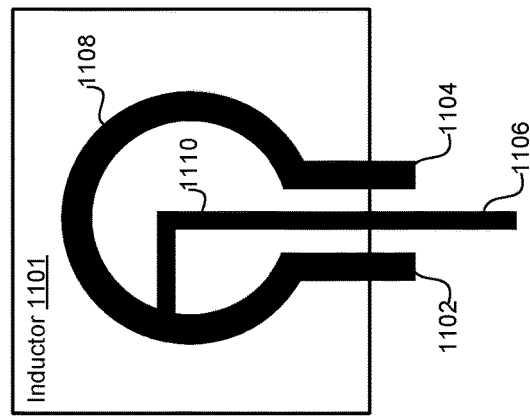

FIG. 11A shows an example of an inductor 1101 that is a tapped inductor. In addition to end terminals 1102 and 1104, inductor 1101 includes a tapped terminal 1106 that connects to an intermediate location between end terminal 1102 and end terminal 1104. Thus, in addition to metal loop 1108, which extends between end terminal 1102 and end terminal 1104, inductor 1101 includes metal connector 1110, which connects from an intermediate location of metal loop 1108 to tapped terminal 1106, thus allowing coupling of an input or output at an intermediate location. For example, in some cases, it may be advantageous to couple an amplifier between an end terminal and a tapped input terminal (e.g. between end terminal 1102 and tapped terminal 1106) and thus provide an input through a tapped terminal. End terminals may be connected to other components, e.g. connecting to capacitors in a ring arrangement such as in LC tank 948.

FIG. 11B shows an example of a schematic illustration of an implementation of a VCO 1100 including LC tank 948 of FIG. 9A using tapped inductors such as inductor 1101 of FIG. 11A, i.e. where inductors 974 and 976 of LC tank 948 are tapped inductors. Amplification is provided to inductors 974, 976 through tapped input terminals. Specifically, amplifier 1002 is connected to tapped terminal 1112 of inductor 976 and amplifier 1004 is connected to tapped terminal 1114 of inductor 974. Amplifiers 1002 and 1004 may be considered collectively as an example implementation of amplifier 764 of VCO 760 and may provide electrical input to LC tank 948 and amplify an electrical signal in LC tank 948 to generate an oscillator signal at the resonant frequency of LC tank 948 (e.g. voltage V1 or V2 may be an oscillator signal).

Figure 11C:
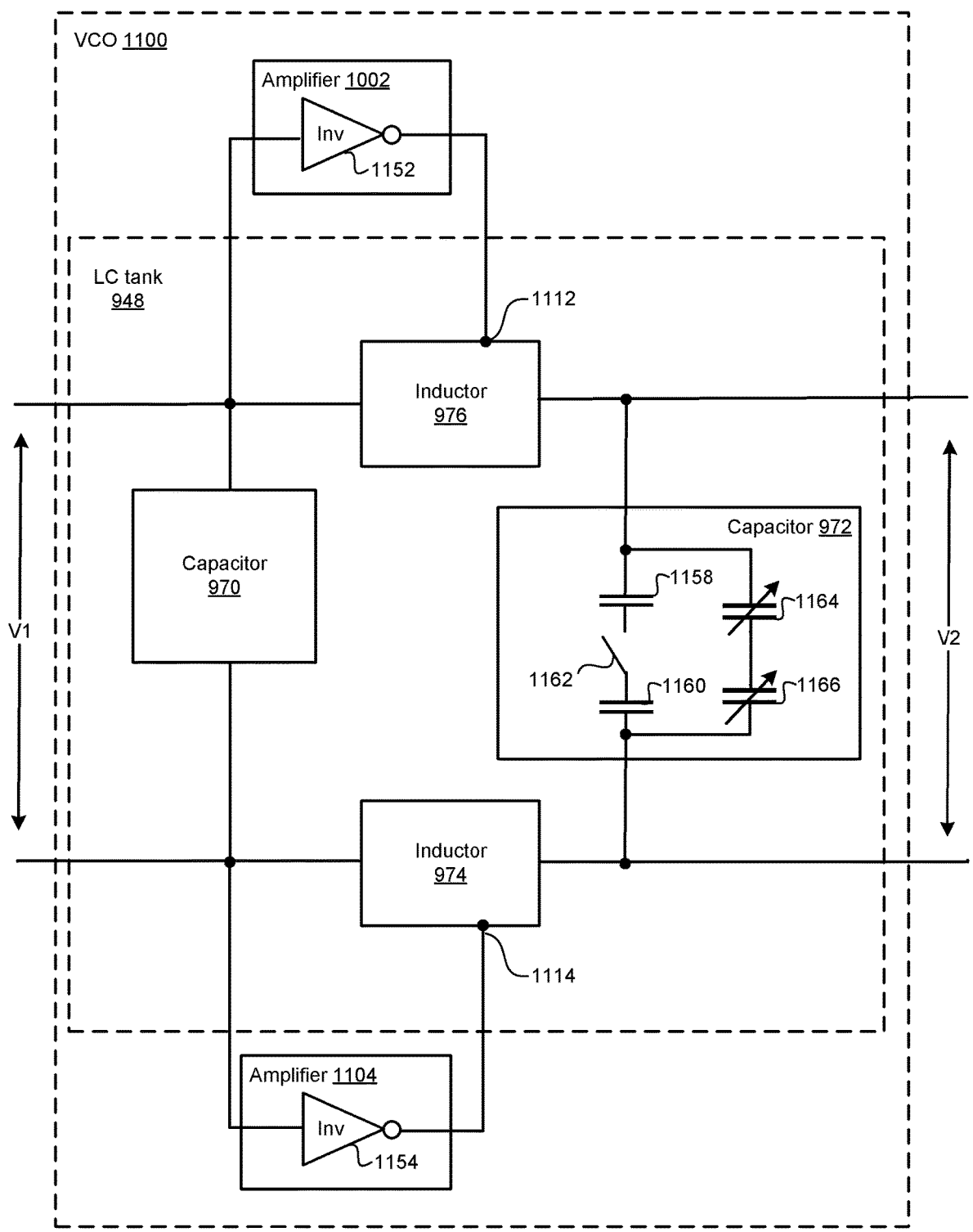

FIG. 11C shows a more detailed example of VCO 1100 (which may be considered an example of how VCO 1100 may be implemented using particular components including tapped inductors, inverters connected to tapped terminals of the tapped inductors, and variable capacitors). Amplifier 1002 is implemented by a single inverter 1152 that has its output connected to tapped terminal 1112 of inductor 976. Amplifier 1004 is implemented by a single inverter 1154 that has its output connected to tapped terminal 1114 of inductor 974. Thus, amplification in VCO 1100 is provided by a pair of differential inverters including inverter 1152 and inverter 1154. Capacitor 970 and capacitor 972 are implemented as variable capacitors, each with a capacitance that is variable over a range to control a resonant frequency of LC tank 948. Capacitor 972 includes capacitive element 1158 and capacitive element 1160 with switch 1162 to modify a capacitance of capacitor 972 by discrete amounts according to connection of capacitive element 1158 and capacitive element 1160. Capacitor 972 includes variable capacitive elements 1164 and 1166 each with a respective capacitance that is variable over a continuous range according to an applied voltage. Capacitor 970 may include similar components to those shown in Capacitor 972 so that the capacitance of capacitor 970 may also be configured (components of capacitor 970 are omitted from FIG. 11C). It can be seen that VCO 1100 provides a simpler implementation than a symmetric implementation.

While LC tank 948 of the above examples is illustrated as including two capacitors and two inductors in a ring configuration, in alternating order (capacitor, inductor, capacitor, inductor), the present technology is not limited to any particular number of components and may be implemented with more than two inductors and more than two capacitors, e.g. three capacitors and three inductors, four capacitors and four inductors, five capacitors and five inductors, etc.

FIG. 12 shows an example of an LC tank 1200 that includes four capacitors 1202, 1204, 1206, and 1208 and four inductors 1212, 1214, 1216, and 1218 connected in a ring configuration with each capacitor connected in series between a pair of the inductors and each inductor connected in series between a pair of the capacitors. For example, capacitor 1202 is connected between inductors 1218 and 1212, capacitor 1204 is connected between inductors 1212 and 1214, and so on, and inductor 1212 is connected between capacitors 1202 and 1204, inductor 1214 is connected between capacitors 1204 and 1206 and so on. Such a ring configuration may be extended to any number of components and is not limited to two-capacitor, two-inductor examples (e.g. LC tank 948) and four-capacitor, four-inductor examples (e.g. LC tank 1200) that are shown in the drawings. It will be understood that the term "ring configuration" may refer to two-terminal elements such as capacitors and inductors that are connected in series, or concatenated, such that one and only one terminal of any element is connected to one and only one terminal of the next element in a closed loop (tapped terminals are not used for connection to capacitors so that inductors may be considered two-terminal elements for purposes of forming such connections). One or more of capacitors 1202, 1204, 1206, and 1208 may be variable capacitors to tune the resonant frequency of LC tank 1200. One or more of inductors 1212, 1214, 1216, and 1218 may be tapped inductors to allow connection of amplifiers to tapped terminals.

Circuits described above may be used in various applications. Methods of using a resonant tank, such as LC tank 948 or LC tank 1200, are summarized with reference to the high level flow diagram shown in FIG. 13. Referring to FIG. 13, step 1300 involves providing an electrical input to a resonant tank that includes a first capacitor, a first inductor, a second capacitor, and a second inductor, formed on the semiconductor substrate, and connected in a ring configuration with each capacitor connected in series between inductors, and with each inductor connected in series between capacitors. For example, one or more amplifiers may be connected to terminals of a resonant tank to provide an electrical input to the resonant tank. Still referring to FIG. 13, step 1302 involves amplifying an electrical signal generated from the electrical input in the resonant tank to generate the oscillator signal at a resonant frequency of the resonant tank. For example, a resonant tank may generate an electrical signal at a resonant frequency and an amplifier may amplify this electrical signal to generate the oscillator signal (e.g. oscillator signal of a VCO).

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

Although the present disclosure has been described with reference to specific features and embodiments thereof, it is evident that various modifications and combinations can be made thereto without departing from scope of the disclosure. The specification and drawings are, accordingly, to be regarded simply as an illustration of the disclosure as defined by the appended claims, and are contemplated to cover any and all modifications, variations, combinations or equivalents that fall within the scope of the present disclosure. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
A first inductor having a first end and a second end, a second inductor having a first end and a second end, a first capacitor having a first end and a second end, a second capacitor having a first end and a second end;
a first amplifier having a first end and a second end;
a second amplifier having a first end and a second end;
wherein:
the first end of the first capacitor is coupled to the first end of the first inductor, and the second end of the first capacitor is coupled to the first end of the second inductor;
the first end of second capacitor is coupled to the second end of the first inductor, and the second end of the second capacitor is coupled to the second end of the second inductor;
the first amplifier is coupled to provide an amplification across the first inductor; and
the second amplifier is coupled to provide an amplification across the second inductor; and wherein the first inductor further having a first tapped end, wherein the first end of the first amplifier is coupled to the first end of the first inductor, and the second end of the first amplifier is coupled to the first tapped end of the first inductor.

2. The apparatus of claim 1, wherein the first amplifier is coupled to provide amplification of signal with opposite directions.

3. The apparatus of claim 1, wherein the first end of the first amplifier is coupled to the first end of the first inductor, and the second end of the first amplifier is coupled to the second end of the first inductor; wherein the first end of the second amplifier is coupled to the first end of the second inductor, and the second end of the second amplifier is coupled to the second end of the second inductor.

4. The apparatus of claim 1, wherein the first amplifier comprises a first inverter, wherein the input of the first inverter is coupled to the first end of the amplifier, and the output of the first inverter is coupled to the second end of the first amplifier.

5. The apparatus of claim 4, wherein the first amplifier further comprises a second inverter, wherein the second inverter and the first inverter are coupled with opposite orientation.

6. The apparatus of claim 1, wherein the second inductor further having a first tapped end, wherein the first end of the second amplifier is coupled to the first end of the second inductor, and the second end of the first amplifier is coupled to first tapped end of the first inductor.

7. The apparatus of claim 1, wherein the first capacitor comprise a first tunable capacitor and a second tunable capacitor coupled in series.

8. The apparatus of claim 7, wherein the first capacitor comprise a first fixed capacitor and a second fixed capacitor coupled in series through a switch.

9. The apparatus of claim 1, wherein the apparatus forms a Voltage Controlled Oscillator (VCO) in a Phase Locked Loop (PLL) circuit that further includes a feedback loop, a phase detector, and a filter.

10. An oscillator circuit, comprising:
a first inductor having a first end and a second end, a second inductor having a first end and a second end;
a first amplifier having a first end and a second end, a second amplifier having a first end and a second end;
wherein the first end of the first amplifier comprises two differential inputs, the second end of the first amplifier comprises two differential outputs;
wherein the first inductor comprises two tapped ends;
wherein the two differential outputs of the first amplifier are coupled to the two tapped ends of the first inductor, and the two differential inputs of the first amplifier are respectively coupled to the first end and the second end of the first inductor.

11. The oscillator circuit of claim 10, wherein the first end of the second amplifier comprises two differential inputs, the second end of the second amplifier comprises two differential outputs;
wherein the second inductor comprises two tapped ends;
wherein the two differential outputs of the second amplifier are coupled to the two tapped ends of the second inductor, and the two differential inputs of the second amplifier are respectively coupled to the first end and the second end of the second inductor.

12. The oscillator circuit of claim 11, further comprising a first capacitor having a first end and a second end, a second capacitor having a first end and a second end;

wherein the first end of the first capacitor is coupled to the first end of the first inductor, and the second end of the first capacitor is coupled to the first end of the second inductor;

the first end of second capacitor is coupled to the second end of the first inductor, and the second end of the second capacitor is coupled to the second end of the second inductor.

13. The oscillator circuit of claim 12, wherein the first capacitor comprise a first tunable capacitor and a second tunable capacitor coupled in series.

14. The oscillator circuit of claim 13, wherein the first capacitor comprise a first fixed capacitor and a second fixed capacitor coupled in series through a switch.

15. An oscillator circuit, comprising:

A first inductor having a first end and a second end, a second inductor having a first end and a second end, a first capacitor having a first end and a second end, a second capacitor having a first end and a second end;

a first amplifier having a first end and a second end;

a second amplifier having a first end and a second end;

wherein:

the first end of the first capacitor is coupled to the first end of the first inductor, and the second end of the first capacitor is coupled to the first end of the second inductor;

the first end of second capacitor is coupled to the second end of the first inductor, and the second end of the second capacitor is coupled to the second end of the second inductor;

the first amplifier is coupled to provide an amplification across the first inductor; and the second amplifier is coupled to provide an amplification across the second inductor;

wherein the first capacitor comprise a first tunable capacitor and a second tunable capacitor coupled in series.

16. An oscillator circuit of claim 15, wherein the first capacitor comprise a first fixed capacitor and a second fixed capacitor coupled in series through a switch.

* * * * *